United States Patent [19]

Shibayama et al.

[11] Patent Number: 4,532,598
[45] Date of Patent: Jul. 30, 1985

[54] ELECTRON BEAM EXPOSURE SYSTEM

[75] Inventors: Akinori Shibayama, Tokyo; Minpai Fujinami, Iruma; Haruo Yoda, Tokyo, all of Japan

[73] Assignees: Hitachi, Ltd.; Nippon Telegraph & Telephone Public Corporation, both of Tokyo, Japan

[21] Appl. No.: 386,301

[22] Filed: Jun. 8, 1982

[30] Foreign Application Priority Data

Jun. 10, 1981 [JP] Japan .................. 56-88183

[51] Int. Cl.³ .................. G01K 1/08; H01J 3/14; H01J 3/26
[52] U.S. Cl. .................. 364/491; 250/398; 250/492.2
[58] Field of Search .............. 364/468, 490, 491, 512, 364/518, 521, 525; 250/492.2, 358.1, 398, 492.3; 29/574, 577 C

[56] References Cited

U.S. PATENT DOCUMENTS

| | | | |
|---|---|---|---|
| 3,894,271 | 7/1975 | Pfeiffer et al. | 250/492.2 |
| 4,145,597 | 3/1979 | Yasuda | 250/492.2 |
| 4,147,937 | 4/1979 | Buelow et al. | 250/492.2 |
| 4,151,422 | 3/1979 | Goto et al. | 250/492.2 |
| 4,167,676 | 9/1979 | Collier | 250/398 |
| 4,213,053 | 7/1980 | Pfeiffer | 250/398 |
| 4,280,186 | 7/1981 | Hidai et al. | 250/492.2 |
| 4,291,231 | 9/1981 | Kawashima | 250/442.1 |
| 4,393,312 | 7/1983 | Collier | 250/492.2 |
| 4,424,448 | 1/1984 | Takigawa et al. | 250/492.2 |

OTHER PUBLICATIONS

Fujinami et al., *Precision Electron Beam Exposure System EB52*, Review of the Electrical Communications Laboratories, vol. 27, #1-2, (1,2/79), pp. 97-104.

Primary Examiner—James D. Thomas
Assistant Examiner—Dale M. Shaw
Attorney, Agent, or Firm—Antonelli, Terry & Wands

[57] ABSTRACT

An electron beam exposure system of a variable shaped electron beam type in which an input pattern of any geometrical shape is decomposed into rectangular patterns of a given size, whereby the pattern is exposed by an electron beam having a cross-section corresponding to the decomposed rectangular pattern. Data for the input pattern is compared with data for the rectangular cross-sectional pattern of the electron beam in a comparator. When the comparison results is that the input pattern should be decomposed into rectangular patterns, the former is decomposed into two sub-patterns, one of which is outputted while the other again undergoes the comparison with the rectangular pattern parameters. The processing of decomposition can be executed at a very high speed in a pipelined system which includes a plurality of processing stages of similar arrangement.

13 Claims, 9 Drawing Figures

ELECTRON BEAM EXPOSURE SYSTEM

The present invention relates in general to an electron beam exposure system for drawing patterns by using an electron beam having a rectangular cross-section. In particular, the invention concerns an electron beam exposure system of variably shaped electron beam type in which an input graphic pattern of a given shape is decomposed into rectangular patterns, each of which has a given size and is depicted by an electron beam having a cross-section corresponding to the rectangular pattern.

As the electron beam (EB) exposure system of the variably shaped electron beam type, there has been known an apparatus in which the electron beam having a rectangular cross-section of a given dimension is formed in accordance with data for a pattern to be exposed so that the exposure of that pattern can be accomplished by a single irradiation of the electron beam. The EB exposure system of this type is advantageous in that pattern exposure through irradiation by the electron beam can be carried out at significantly increased speed as compared with the EB exposure system in which a pattern to be depicted is scanned throughout by an electron beam of a very small diameter line by line.

However, in order to maximize the advantage of the EB exposure system of the variably shaped electron beam type to thereby attain the highest possible speed, it is required to supply data of the pattern to be exposed at a speed compatible with the maximum exposure speed of the EB pattern exposure unit. When an LSI pattern is designed with the minimum line width of 1 $\mu$m or less, the quantity of data required for a single LSI pattern will amount to several hundred mega bytes and it will be required to transfer data at a rate of several tens of mega bytes per second. This data quantity required is several times higher than that of the conventional high-speed mini-computer, while the required data transfer speed is several orders of magnitude as high as that of the latter. Thus, difficulty has been encountered in practice in realizing such a high speed EB exposure system.

One of the obstacles encountered in realizing such a high speed EB exposure system resides in the fact that a limitation is imposed on the size of the sectional dimension of the electron beam in order to suppress blur and geometrical distortion of the electron beam at the edge thereof within a permissible tolerance. To this end, all the patterns to be exposed have to be initially decomposed into smaller rectangular sub-patterns of a size which can be exposed through a single irradiation of the electron beam.

Under the circumstances, if the data for patterns of an arbitrary size to be exposed is stored in and this data is supplied from a mini-computer, for example, and automatically transformed into data for irradiation at a high speed, the quantity of data to be transferred from the mini-computer can be reduced significantly, e.g. by one order of magnitude, which results in a corresponding decrease of the required data transfer speed. It is thus expected that a high speed EB exposure system for practical applications, such as lithography, can be realized by solving this problem.

In this connection, there has been proposed an EB exposure or lithography system in which data concerning only dimensions and positions (coordinates) of a rectangular pattern of an arbitrary size to be depicted and the number of preselected decomposition elements are outputted from a computer, wherein the rectangular pattern is decomposed or disintegrated into rectangular sub-patterns of a size smaller than a predetermined one by using a circuit designed specifically to this end, and the pattern exposure is effected by means of an electron beam having a rectangular cross-section corresponding to that of the rectangular sub-pattern, as is disclosed in Japanese patent applications Laid-Open Nos. 73577/1979 and 83722/1979, for example.

However, the hitherto known apparatus is disadvantageous in that patterns other than rectangular ones such as trapezoids and the like, can not be generated, and therefore, such apparatus is lacking in flexibility for generating various patterns of different shapes with high freedom.

Accordingly, an object of the present invention is to provide an electron beam exposure system in which the shortcomings of the hitherto known system can be overcome and which is capable of generating patterns of various shapes or forms by using a common circuit at an extremely increased speed.

In view of the above object, there is provided according to an aspect of the invention an electron beam exposure system in which an electron beam having a rectangular cross-section of an adjustable size is formed in accordance with data of a pattern to be exposed and a pattern corresponding to the rectangular cross-section is exposed through a single irradiation of the electron beam, and which system comprises a plurality of unit circuits connected in cascade in a plurality of stages, each of the unit circuits including storage means for storing data as to shape, size and position of an input graphic pattern to be depicted, comparison means for determining whether the input graphic pattern should be decomposed or not on the basis of the data on the type, size and the position of the input graphic pattern, and arithmetic operation means for decomposing the input graphic pattern into two sub-patterns when the input graphic pattern is discriminated to be decomposed, providing data of shape, size and position for each of the two sub-patterns, outputting the data for one of the sub-patterns being outputted, and reloading the data for the other sub-pattern in the storage means, wherein the plurality of unit circuits are operated in a pipeline manner and the pattern to be depicted is progressively decomposed into the rectangular sub-patterns each of which is capable of being exposed through a single irradiation of the electron beam.

The present invention will be apparent from the following detailed description taken in conjunction with the accompanying drawings, in which:

FIGS. 1 to 6 are views to illustrate the principle of operation of an apparatus according to the invention, wherein

Now, the invention will be described in detail in conjunction with exemplary embodiments thereof by referring to the accompanying drawings.

In the following description, it is assumed that the pattern to be depicted is a given one of various trapezoidal patterns, including parallelogram graphic patterns fundamentally composed of sides of vertical, lateral and 45° slanted directions.

In the first place, description will be made in detail as to the manner in which a trapezoidal pattern is decomposed to thereby generate small rectangular patterns (referred to as sub-patterns) each to be exposed at one time.

Figure 1:
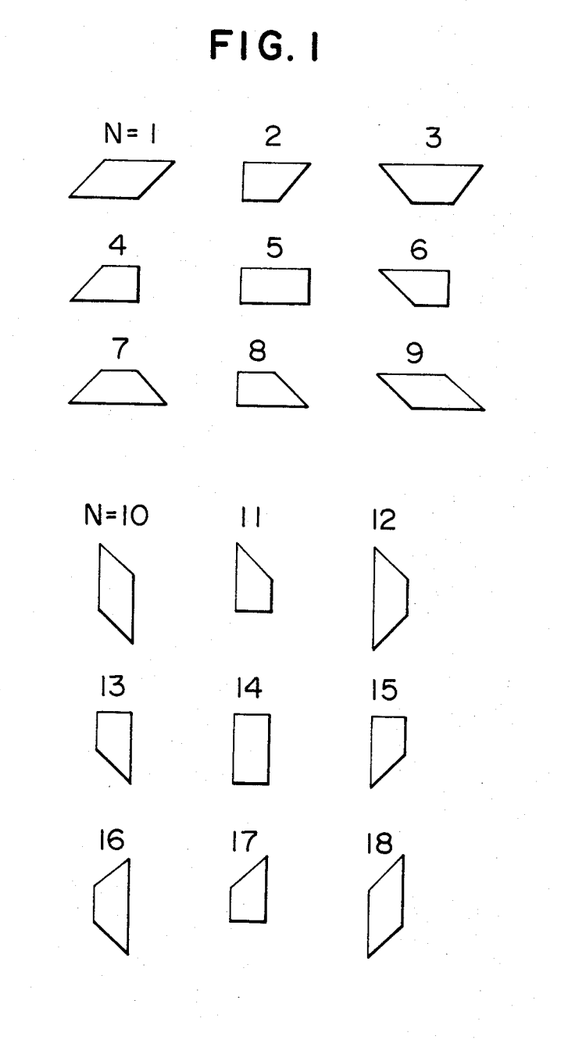
FIG. 1 shows a variety of input graphic patterns and FIGS. 2 to 6 illustrate processes of decomposition effected at cascaded unit circuit stages in succession.

FIG. 1 shows a variety of shapes of input graphic patterns to be depicted or exposed, which are discriminated from one another by identifying numbers N where N=1, . . . , or 18. The group of the graphic patterns as illustrated may include a triangular pattern as an extreme case. For example, when the width of the bottom side of the pattern identified by 2 (i.e. N=2) is reduced to zero, the resulting pattern is regarded as a triangular pattern.

In general, in the electron beam pattern exposure system in which an electron beam of a variable section is employed for exposure, all the graphic patterns to be written are limited to rectangular patterns of dimensions falling within a predetermined size. Accordingly, all the graphic patterns shown in FIG. 1 must be decomposed into smaller rectangular patterns each having long sides $L_1$ and short sides $L_2$ which are not greater than respective predetermined lengths and in which $L_1 \geq L_2$.

Next, a process of decomposing a trapezoidal pattern into smaller rectangular patterns or sub-patterns will be described. In the case of the illustrated example, it is assumed that the decomposition is effected fundamentally at three steps or stages. At the first stage, a trapezoidal pattern to be depicted or written is sliced into elongated patterns. In view of the fact that the input graphic pattern to be exposed has a pair of sides which extend in parallel with each other either in the lateral (horizontal) or vertical direction, a pattern elongated along the parallel sides is first cut out from the input pattern.

Figure 2:
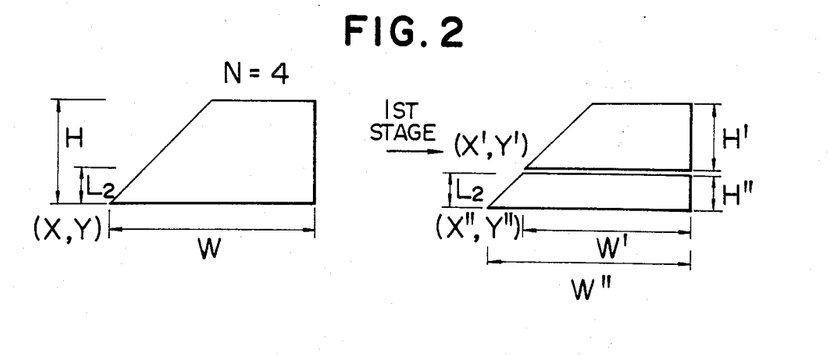

A typical processing for the cutout of an elongated sub-pattern is illustrated in FIG. 2. The input pattern in concern is the one identified by the pattern identifying No. 4 (N=4) in FIG. 1. As can be seen from FIG. 2, an elongated pattern is cut out from the trapezoidal pattern along the bottom side thereof and transferred to a second stage or step. On the other hand, the upper remaining portion of the input or original trapezoidal pattern replaces the latter at the first processing stage and again undergoes a similar decomposition process. In FIG. 2, reference letters H and W represent, respectively, the height and the width of the original input graphic pattern, X and Y denote coordinates of the same at the lower left corner, $L_2$ represents the height of the elongated sub-pattern to be cut out, H″ and W″ represent, respectively, the height and the width of the elongated pattern, X″ and Y″ denote the coordinates of the elongated pattern, H′ and W′ represent, respectively, the height and the width of the residual pattern portion which is left behind after the decomposition, and X′ and Y′ denote the coordinates of the residual pattern portion.

In this decomposition process, when it is discriminated that $H \leq L_2$, this means that the decomposition process for the input pattern is completed with respect to the first stage and that graphical data as obtained is immediately transferred to the second stage, while another input original pattern data to be decomposed is supplied to the first stage.

In the processing of decomposition now being illustrated, it is first discriminated whether the pattern in concern is to be decomposed or not by comparing the parameter H with $L_2$. Subsequently, arithmetic operation or execution has to be done for providing numerical data for the residual pattern portion remaining after the decomposition and for the pattern to be outputted or transferred from the first stage.

More specifically, numerical calculations are required for providing the data of the residual pattern portion through the following transformations:

$N \rightarrow N'$ $H - L_2 \rightarrow H'$ $W - L_2 \rightarrow W'$ $X + L_2 \rightarrow X'$ $Y + L_2 \rightarrow Y'$ For the data of the pattern cut out for transfer (output), the following arithmetic procedures are required:

$N \rightarrow N''$ $L_2 \rightarrow H''$ $W \rightarrow W''$ $X \rightarrow X''$ $Y \rightarrow Y''$ The calculation processings mentioned above become different in dependence on the input or original pattern and hence the identifying numbers N thereof. However, it will be readily appreciated that the arithmetic operations or calculations can be accomplished through addition and/or subtraction effected on the basis of data of H, W, X, Y and $L_2$ throughout all the patterns. Through these arithmetic processings, each of the graphic patterns numbered 1 to 9 (FIG. 1) can be decomposed into elongated patterns each having a width not greater than $L_2$ and extending along the horizontal direction in the first stage, while the patterns 10 to 18 are decomposed into elongated patterns in the vertical direction, each of the elongated patterns also having a width not greater than $L_2$.

In the second stage, a triangular portion located at one end or both end portions of the elongated pattern is cut out from the latter. However, when the elongated pattern presents a parallelogram, there may arise such a case in which the pattern can not be decomposed into triangles. In this case, the parallelogram is decomposed into smaller parallelograms each having a width not greater than $L_1$, as will be described hereinafter.

Figure 3:
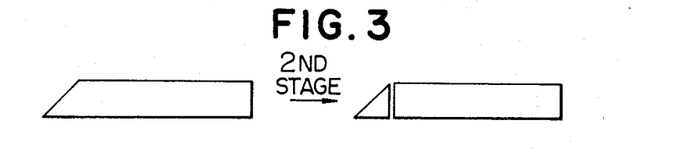
Figure 4:
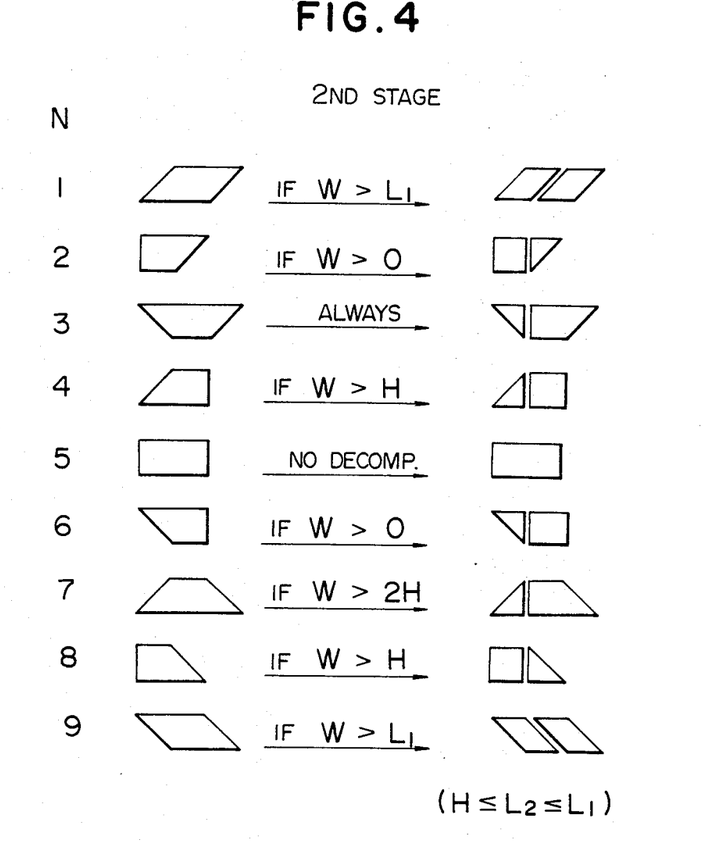

FIG. 3 illustrates a typical example of the processings performed in the second stage. A triangular portion located at the lefthand end (as viewed in FIG. 3) of the pattern with the identifing number N=4 is cut out and transferred to the third stage. The residual pattern portion shown at the righthand side is again subjected to the decomposition process except for the case where no further decomposition is found to be necessary from the results of comparisons of the parameters N, W and H. The data obtained in the second stage is transferred to the third stage, and another input pattern data is supplied or transferred from the first stage. In FIG. 4, there are illustrated conditions for the decomposition required in the second stage, which conditions differ from one another in dependence on the identifying number of the input pattern. For example, the decomposition of the pattern N=3 or N=7 will be followed by further decomposition shown at N=2 or N=8. It will be noted that for the patterns 10 to 18 shown in FIG. 1, similar conditions as those shown in FIG. 4 apply by interchanging H and W.

In the second stage, it is discriminated whether decomposition is required or not in accordance with the conditions illustrated in FIG. 4. When decomposition is necessary, addition and/or subtraction processings are performed on the parameters W, H, X and Y in the manner similar to those in the first stage to provide data of a triangle and the residual pattern after the decomposition.

Figure 5:
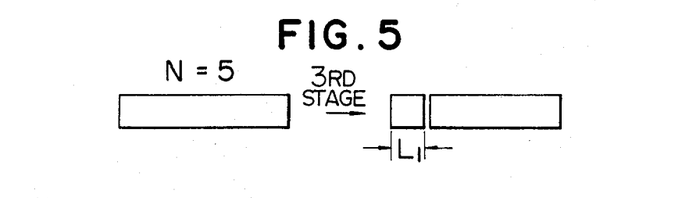

The third stage is the final stage of decomposition. In this stage, output processing is carried out by decomposing an input pattern into smaller rectangular patterns each of which can be really exposed at a single time in the electron beam exposing or lithography unit. More particularly, an input rectangular pattern generated at the second step and corresponding to the pattern identified by 5 (i.e. N=5) in FIG. 1 is decomposed into smaller rectangles each having a decomposed width $L_1$, as is illustrated in FIG. 5. In the case of the example shown in FIG. 5, the condition for the required decomposition is $W > L_1$, wherein the decomposition processing is effected in the same manner as in the first stage. However, the patterns other than rectangles each of which includes necessarily at least one oblique side has to be decomposed into a group of smaller rectangles which approximate as a whole the oblique side. Thus, for the input patterns other than the rectangular pattern, a number of the smaller divided rectangles are generated on the basis of the input pattern by making use of the oblique side decomposing width $L_3$ as a parameter in the third stage.

Figure 6:
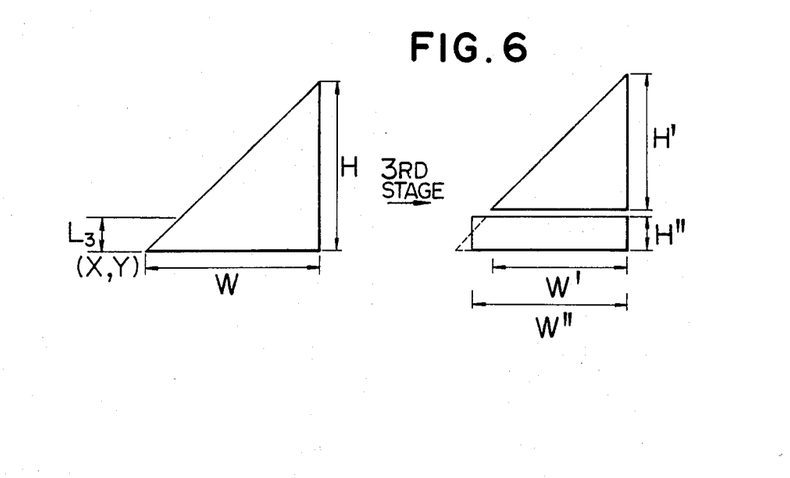

A typical example of the above processing is illustrated in FIG. 6. A triangle input pattern is decomposed into elongated patterns each having a width $L_3$ from and along the bottom side so far as the condition that $H > L_3$ is met. The data of the elongated pattern cut out from the bottom portion of the input pattern is transferred to an electron beam exposure unit as depictable pattern data, while the residual upper pattern portion is again supplied to the input of the third stage.

For the decomposition processing effected in the third stage and illustrated in FIG. 6, arithmetic operations are executed for the pattern data of the residual pattern portion through the following transformations:

$N \rightarrow N'$ $H - L_3 \rightarrow H'$ $W - L_3 \rightarrow W'$ $X + L_3 \rightarrow X'$ $Y + L_3 \rightarrow Y'$ And for the pattern data to be outputted:

$L_3 \rightarrow H''$ $W - L_3/2 \rightarrow W''$ $X + L_3/2 \rightarrow X''$ $Y \rightarrow Y''$ These arithmetic processings can be realized through addition and/or subtraction of W, H, Y and $L_3$ in similar manner as those in the first and the second stages. Although the actual processings differ slightly one to another in dependence on the pattern identifying number, they are fundamentally similar to one another in that they can be realized through the processings of W, H, X, Y and $L_3$ in the light of the conditions for required decomposition and the arithmetic processings of these parameters.

The processings performed in the first to the third stages may be so combined that the processings at the respective stages can be effected in parallel (in pipeline) and that a new processing in one stage is suspended until the processing in the succeeding stage has been completed. Then, the input pattern data is sequentially transferred from the first stage to the third stage.

Figure 7:
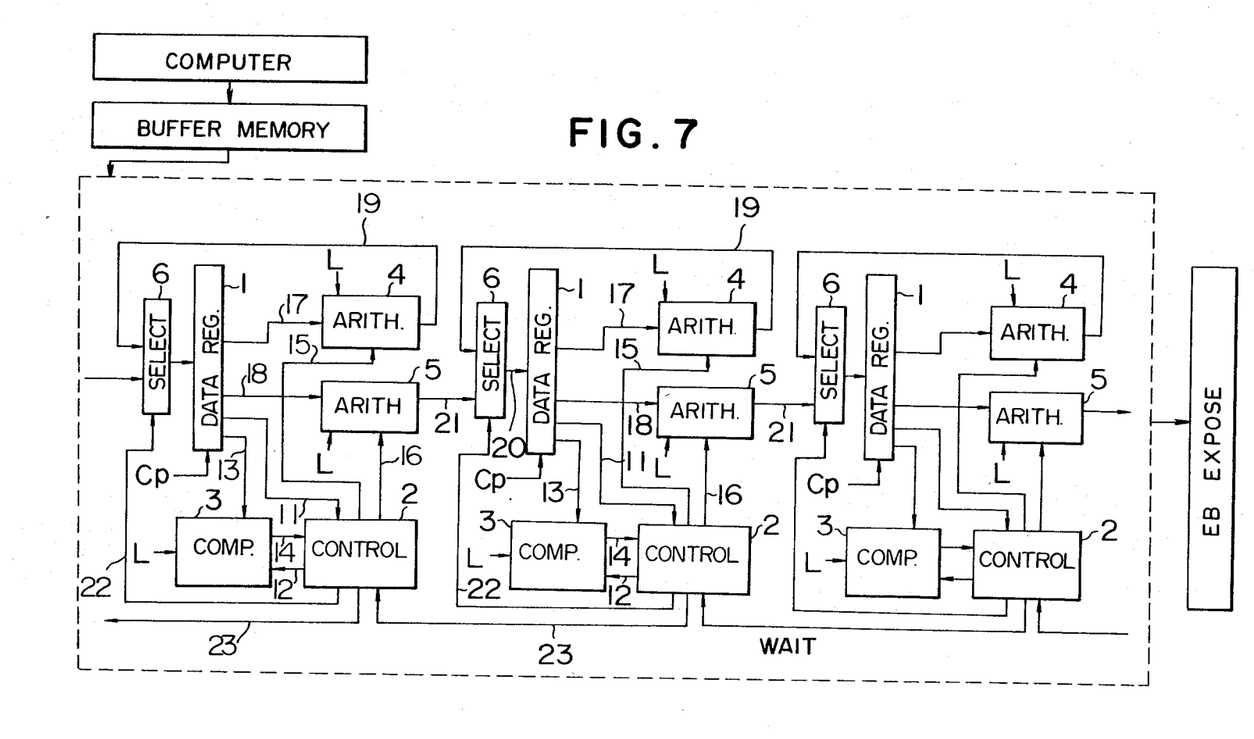
FIG. 7 shows in a block diagram an EB exposure system according to an embodiment of the invention.

FIG. 7 shows in a block diagram an EB exposure system according to an exemplary embodiment of the invention which is adapted to decompose an input graphic pattern in three stages in the manner described above. As will be seen from the figure, the circuit stages are of an identical arrangement with one another. Accordingly, the following description will be limited to the circuit arrangement and operation of a single stage.

Referring to FIG. 7, a data register 1 is adapted to store therein that data which relates to the shape identification number N, width W, height H and coordinates (X, Y) of an input graphic pattern. The data loaded in the data register 1 is constituted by either the output data supplied from the preceding stage or the residual pattern data remaining after decomposition effected by the very stage to which that data register belongs as will be described hereinafter in more detail.

The data stored in the data register 1 is read out at the timing of a timing clock signal $C_P$. The graphic pattern identifying number N contained in the data register 1 is supplied to a control circuit 2 by way of a signal line 11, while a comparison command signal corresponding to the pattern identifying number N is supplied to a comparison circuit 3 through a signal line 12. The comparison circuit 3 has inputs supplied with the data signals representative of the width W and the height H of the input pattern from the data register 1 by way of a signal line 13 and the other input externally supplied with the decomposition width parameters $L_1$, $L_2$ and $L_3$ (hereinafter denoted generally by L). The comparator circuit 3 thus performs desired comparison processings by making use of the input pattern parameters W and H and the decomposition width parameter L in accordance with the comparison command supplied through the signal line 12 to thereby arithmetically derive the conditions on which the input pattern is to be decomposed. The results of the comparison are then supplied to the control circuit 2 through a signal line 14. The control circuit 2 in turn discriminates on the basis of the results of the comparison whether the input pattern be decomposed or not. When the input pattern is discriminated to be decomposed, the contents of arithmetic operations to be effected by arithmetic operation circuits 4 and 5 are determined in dependence on the input pattern identifying number N, whereby corresponding control signals are supplied to the arithmetic operation circuits 4 and 5 through signal lines 15 and 16. Further, the data signals N, W, H and (X, Y) read out from the data register 1 are inputted to the arithmetic operation circuits 4 and 5 through signal lines 17 and 18, respectively, while the decomposition width parameter L is externally supplied to the circuits 4 and 5. The arithmetic operation circuit 4 calculates the one hand, the residual pattern data on the basis of the input data, the result of the calculation is again transferred to the data register 1 through signal lines 19 and 20 and a selector circuit 6 to update the contents of the data register 1. On the other hand, the arithemtic operation circuit 5 arithmetically derives the data of a cut out pattern, which data is supplied to the following selector circuit 6 constituting a part of the following stage and is stored in the data register 1 of that stage. The processings mentioned above are performed when the control circuit 2 discriminates that the decomposition is necessary. In contrast, when it is discriminated that the decomposition is unnecessary, a corresponding control signal is supplied to the arithmetic operation circuit 5 through a signal line 16, as a result of which the input pattern data N, W, H and (X, Y) in the data register 1 are transferred, as they are, to the selector circuit 6 of the succeeding stage through the arithmetic operation circuit 5 and a signal line 21. At the same time, a change-over or switching signal is supplied to the selector circuit 6 through a signal line 22 to cause the selector circuit 6 to be changed over to the state in which the pattern data outputted from the preceding stage is allowed to be loaded in the data register 1 of the present stage.

In this connection, it is to be noted that data W, H and (X, Y) of the decomposed or cut out pattern are provided arithmetically (i.e. through calculation) by the arithmetic operation circuit 5, while the shape identification number N is provided by the control circuit 2 on the basis of the data N available from the data register 1 and the output data from the comparison circuit 3.

The operation described above is carried out in a single stage. It will however be appreciated that similar operations take place in parallel in all of the three stages in pipeline at the timing of the clock signal $C_P$.

Accordingly, when pattern data obtained through the decomposition processings of one stage is inputted to a succeeding stage which is still in the course of decomposition processing of a certain input pattern, the decomposition operation of the succeeding stage will be jammed. Thus, it is necessary to suspend temporarily the new processing of the preceding stage, when the stage succeeding thereto is still performing the decomposition processings. To this end, a wait signal is transmitted to the control circuit 2 of the preceding stage through a signal line 23 from the control circuit 2 of the stage which is still in the course of performing the decomposition processing. The control circuit 2 of the preceding stage then responds to the wait or standby signal to suspend the new operation of the associated arithmetic circuit 5 and at the same time causes the data outputted from the associated data register 1 to be again loaded in that register 1, as they are, through the arithmetic operation unit 4.

In the circuit shown in FIG. 7, each of the control circuits 2 may be realized by a well known read-only memory (ROM) element which is capable of producing output signals corresponding to combinations of various input signals, respectively.

Figure 8:
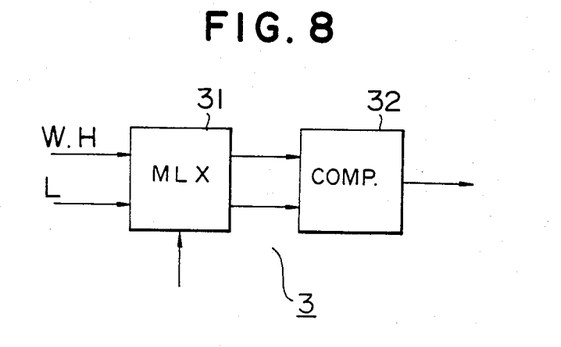
FIG. 8 is a schematic circuit diagram of a comparison circuit employed in the circuit arrangement shown in FIG. 7.

Further, the comparison circuit 3 may be realized in such a configuration as shown in FIG. 8, by way of example.

Referring to FIG. 8, a multiplexer 31 selects the desired data from the data W and H available from the data register 1 shown in FIG. 7 and the externally supplied data L, and supplies the desired data in dependence on the signal N representing the shape of the input pattern and supplied from the control circuit 2 also shown in FIG. 7. In this connection, circuit arrangement may be made such that data signals representative of W/2, H/2 and L/2 or 2W, 2H and 2L corresponding to a bit shift of the data, respectively, can also be selected. A comparator 32 receives the output from the multiplexer circuit 31 to perform comparison, the result of which is supplied to the control circuit 2 shown in FIG. 7. For example, assuming that the input pattern of the identification number N=4 is subjected to decomposition processing in the second stage, the multiplexer circuit 31 selects the data W and H which are then supplied to the comparator 32 where magnitudes of these data are compared to each other to produce a corresponding output signal.

It is also possible to provide two or more sets of the multiplexer and the comparator connected in the manner mentioned above so that more complicated decomposition can be accomplished on the results of comparisons.

Figure 9:
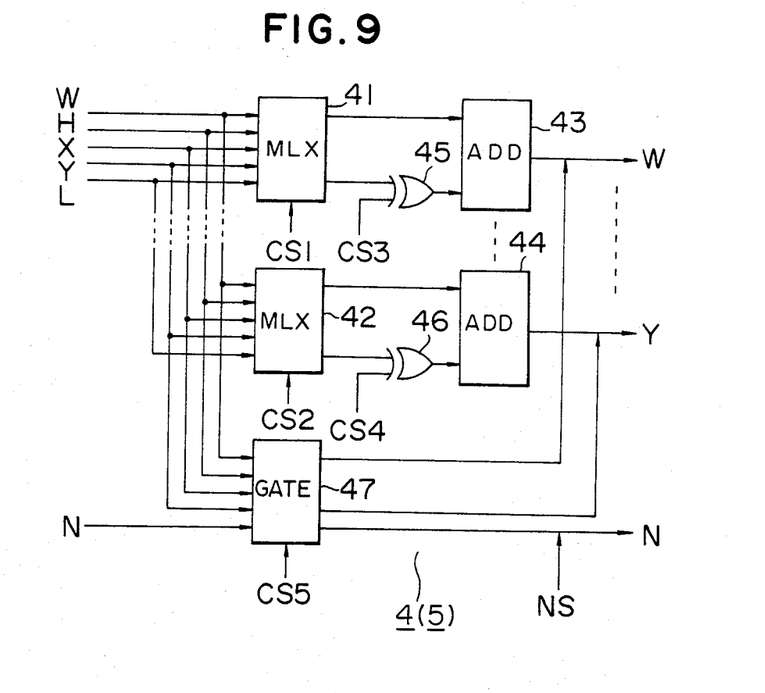
FIG. 9 is a circuit diagram showing in detail an arithmetic operation circuit employed in the circuit arrangement shown in FIG. 7.

The arithmetic operation circuit 4 or 5 shown in FIG. 7 may be realized in a configuration shown in FIG. 9, by way of example.

Referring to FIG. 9, reference numerals 41 and 42 denote multiplexers, 43 and 44 denote adders, 45 and 46 denote Exclusive-OR circuits each circuit including a plurality of Exclusive-OR's, and 47 denotes a gate circuit.

Through cooperation of the multiplexers 41 and 42, the adders 43 and 44 and the Exclusive-OR circuits 45 and 46, the pattern data W and Y resulting from the decomposition are generated. The pattern data H and X can be generated by a similar circuit not shown.

Each of the multiplexers 41 and 42 has the inputs supplied with the data W, H, X and Y from the data register shown in FIG. 7 and the data L applied externally, and selects the desired ones from these input data in dependence on control signal CS1 or CS2 supplied from the control circuit 2 shown in FIG. 7 for outputting the selected data after having been shifted, if necessary. The output data from the multiplexers 41 and 42 is applied to the adders 43 and 44 and the Exclusive-OR circuit 45 and 46, respectively. The Exclusive-OR circuits 45 and 46 have the inputs supplied with control signals CS3 and CS4, respectively, from the control circuit 2 shown in FIG. 7. These control signals serve to invert the respective input data through the Exclusive-OR's in each Exclusive-OR circuit. There is also provided another Exclusive-OR for adding "1" (one) when the control signal is "1" (subtraction). The output signals from the Exclusive-OR circuits 45 and 46 are applied to the inputs of the adders 43 and 44, respectively. In this manner, the output data obtained from the multiplexers 41 and 42 undergo addition or subtraction through the associated combinations of the Exclusive-OR circuits and the adders, respectively.

Through the arithmetic operations mentioned above, the pattern data W, H, X and Y of the decomposed pattern is obtained.

On the other hand, the gate circuit 47 has its input supplied with the data W, H, X, Y and N from the data register 1. This input data is outputted from the gate circuit 47 without modification in response to a control signal CS5 supplied from the control circuit 2. In other words, the gate circuit 47 allows the input data to pass therethrough as it is, when it is discriminated by the control circuit 2 that no decomposition is required or when the wait signal is issued from the succeeding stage.

A signal NS representative of the pattern type identification of the decomposed or cut out pattern is supplied to the arithmetic operation circuit from the control circuit 2 and outputted as it is.

In the foregoing, it has been assumed that trapezoidal patterns are decomposed in three stages. The slanted side is assumed to form 45° with respect to the horizontal and vertical axes. However, the invention is never restricted to the illustrated number of the stages nor to the illustrated manner of decomposition. Rather, the decomposition processing may be carried out at a desired number of stages in dependence on the shapes of the input patterns and/or on different discrimination criteria. Also the angle of the slanted side is not limited to 45°. Calculations for such patterns will be apparent to those skilled in the art.

As will be appreciated from the foregoing description, the present invention makes it possible to decompose input graphic patterns of various shape by means of a common circuit with a simplified circuit arrangement. Further, the processing for pattern decomposition can be accomplished at a very high speed by virtue of such arrangement that the processing is realized in a plurality of processing stages in a pipeline arrangement.

The invention thus provides pattern decomposing processing at an extremely high speed with a simplified circuit structure. In the electron beam exposure system, an electron beam having a rectangular cross-section of a given adjustable size is formed in dependence on decomposed pattern data and successive exposure of the decomposed pattern is accomplished by respective single irradiations of the electron beam to form a desired pattern.

We claim:

1. An electron beam exposure system in which an electron beam having a rectangular shaped cross-section of a selectively adjustable size is formed in accordance with data for a graphic pattern to be exposed and a pattern corresponding to said rectangular shaped cross-section is exposed through each single irradiation of said electron beam, comprising a plurality of unit circuits connected in cascade as a plurality of pipelined stages, and means for operating said unit circuits in parallel with one another in a pipeline manner, whereby the data for said graphic pattern to be exposed in sequentially delivered from the final stage of said cascade connection, each of said unit circuits comprising:

storage means for storing data concerning shape, size and position of an input graphic pattern to be exposed;

comparison means connected to said storage means for discriminating whether said input graphic pattern should be decomposed or not on the basis of said data concerning the shape, size and the position of said input graphic pattern as stored in said storage means and predetermined parameters relating to the processing to be performed by each unit circuit; and arithmetic operation means responsive to said comparison means for decomposing said input graphic pattern into two sub-patterns when said comparison means indicates that said input graphic pattern is to be decomposed, deriving data relating to the shape, size and position for each of said two sub-patterns, outputting the data for one of said sub-patterns and reloading the data for the other sub-pattern into said storage means.

2. An electron beam exposure system according to claim 1, wherein said arithmetic operation means includes means for outputting the data of the input graphic pattern supplied from said storage means without modification, when said comparison means determines that said input graphic pattern is not to be decomposed.

3. An electron beam exposure system according to claim 1 or 2, wherein said arithmetic operation means included in said unit circuit of a given stage includes means for reloading the data outputted from said storage means of the unit circuit of said given stage into said storage means without modification, when the arithmetic means of the unit circuit at the stage immediately following said given stage is in the course of decomposing an input pattern.

4. An electron beam exposure system according to claim 1 or 2, wherein said unit circuits are arranged in three stages, and wherein the unit circuit of the first stage operates on the basis of first predetermined parameters to cut out from the input graphic pattern of a trapezoidal form an elongated sub-pattern having one side of a dimension equal to that of one side of said input graphic pattern, the unit circuit of the second stage operates on the basis of second predetermined parameters to decompose the output pattern of said first stage unit circuit into a triangular pattern and a rectangular pattern, and the unit circuit of the third stage operates on the basis of third predetermined parameters to decompose the output patterns from said unit circuit to said second stage to thereby produce said pattern to be exposed by said electron beam.

5. For use with an electron beam exposure system in which an electron beam is generated and controlled having a rectangular shaped cross-section of a size which can be variably adjusted up to an exposable limit in accordance with data for a graphic pattern to be exposed, a pattern generator capable of receiving data of an input graphic pattern having one of a plurality of selected pattern shapes and generating therefrom data in the form of exposable sub-patterns each having a rectangular shape, comprising:

a plurality of unit circuits connected in cascade as pipelined stages for sequentially decomposing an input graphic pattern into exposable rectangular sub-patterns each no larger than the exposable limit of the electron beam in said electron beam exposure system;

each of said unit circuits including first storage means for storing data of a pattern, second storage means for storing preset parameters for pattern decomposition of the received pattern, discrimination means for comparing said data of said received pattern with said preset parameters and discriminating whether decomposition of the pattern is necessary or not, and decomposition means for outputting said data of the pattern without modification when decomposition is not necessary and for decomposing the pattern into sub-patterns which are no longer necessary to be decomposed according to said exposable limit of said electron beam and outputting the data of the decomposed sub-patterns when decomposition is necessary.

6. A pattern generator according to claim 5, wherein said input graphic pattern is a parallelogram, and wherein said decomposition means includes means responsive to said present parameters for dividing said input graphic pattern into sub-patterns each having the shape of a parallelogram.

7. A pattern generator according to claim 5, wherein said preset parameters are such that at least one stage slices an input graphic pattern along one direction and at least another stage divides the sliced pattern perpendicular to said one direction.

8. A pattern generator according to claim 5, wherein said preset parameters are such that peripheral portions and bulk portions of the input graphic pattern are decomposed in different ways.

9. A pattern generator according to claim 5, wherein said decomposition means includes means for generating data of a cut-out sub-pattern which is outputted to the next stage and data for the residual pattern which is reloaded into said first storage means.

10. An electron beam exposure system in which an electron beam has a rectangular shaped cross-section of a size which can be variably adjusted in accordance with data for a graphic pattern to be exposed, and a pattern corresponding to said rectangular cross-section is exposed through each single irradiation of said electron beam, comprising means including a plurality of unit circuits connected in cascade in pipelined stages for decomposing an input graphic pattern into exposable sub-pattern of rectangular cross-section, each of the unit circuits having a function of decomposing a pattern supplied at its input and of supplying decomposed sub-patterns at its output, the unit circuit of the first stage receiving the input graphic pattern, the unit circuits between the first state and the final stage supplying intermediate sub-patterns, and the unit circuit of the final stage supplying the exposable sub-patterns, each of said unit circuits comprising:

storage means for storing data concerning shape, size and positon of an input pattern;

comparison means for discriminating whether said input pattern should be decomposed or not by comparing said data concerning the shape, size and the position of said input pattern with predetermined parameters for pattern decomposition; and arithmetic operation means for outputting said data of the input pattern when said comparison means indicates that said input pattern is not to be decomposed and for decomposing said input graphic pattern into two sub-patterns when said input graphic pattern is to be decomposed, one of said two sub-patterns satisfying said preset parameters so that further decomposition at that stage is no longer necessary, the other of said two sub-patterns being the remaining portion of the input pattern, including means for deriving data as to the shape, size and position for each of said two sub-patterns, supplying the data for said one sub-pattern to the next stage and reloading the data for the other sub-pattern in said storage means, the reloaded data forming a new input pattern for the storage means to repeat decomposition until said comparison means determines that the input pattern is not to be decomposed;

said plurality of the unit circuits being operated in parallel with one another, whereby the data of the exposable sub-patterns is sequentailly delivered from the final stage of said cascade connection.

11. An electron beam exposure system according to claim 10, wherein said arithmetic operation means included in said unit circuit of a given stage includes means for reloading the data outputted from said storage means of the unit circuit of said given stage into said storage means without modification when the arithmetic means of the unit circuit at the stage immediately following said given stage is in the course of decomposing an input pattern.

12. An electron beam exposure system according to claims 10 or 11, wherein said unit circuits are arranged in three stages, and wherein the unit circuit of the first stage operates on the basis of first predetermined parameters to cut out from the input graphic pattern of a trapezoidal form an elongated sub-pattern having one side of a dimension equal to that of one side of said input graphic pattern, the unit circuit of the second stage operates on the basis of second predetermined parameters to decompose the output pattern of said first stage unit circuit into a triangular pattern and a rectangular pattern, and the unit circuit of the third stage operates on the basis of third predetermined parameters to decompose the output patterns from said unit circuit of said second stage to thereby produce said pattern to be exposed by said electron beam.

13. An electron beam exposure system in which an electron beam has a rectangular cross-section the size of which can be variably adjusted in accordance with data for a graphic pattern to be exposed and a pattern corresponding to said rectangular cross-section is exposed through each single irradiation of said electron beam, comprising a plurality of input circuits connected in cascade in a plurality of stages, each of said unit circuits comprising:

storage means for storing data concerning shape, size and position of an input graphic pattern to be exposed;

comparison means for discriminating whether said input graphic pattern shoud be decomposed or not by comparing said data concerning the shape, size and the position of said input graphic pattern with preset parameters for pattern decomposition; and arithmetic operation mean for outputting the data for said input graphic pattern to said storage means at the following stage when said comparison means indicates that said input graphic pattern is not to be decomposed, and for decomposing said input graphic pattern into two sub-patterns when said comparison means indicates that said input graphic pattern is to be decomposed, including means for deriving data as to the shape, size and position concerning each of said two sub-patterns, outputting the data for one of said sub-patterns to said storage means at the following stage and reloading the data for the other sub-pattern in said storage means in such a manner that the other sub-pattern is repeatedly decomposed until said comparison means indicates that it is not to be further decomposed;

said plurality of the unit circuits being operated in parallel with one another, whereby the data for said graphic pattern to be exposed is sequentially delivered from the final stage of said cascade connection.

* * * * *